(12) United States Patent
Takizawa et al.

(10) Patent No.: US 7,675,172 B2
(45) Date of Patent: Mar. 9, 2010

(54) PRINTED CIRCUIT BOARD, MOUNTING METHOD OF ELECTRONIC COMPONENT, AND ELECTRONIC APPARATUS

(75) Inventors: Minoru Takizawa, Sagamihara (JP); Kuniyasu Hosoda, Hanno (JP); Takahisa Funayama, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/146,329

(22) Filed: Jun. 25, 2008

(65) Prior Publication Data
US 2009/0001575 A1 Jan. 1, 2009

(30) Foreign Application Priority Data
Jun. 29, 2007 (JP) .............................. 2007-173365

(51) Int. Cl.
*H01L 23/48* (2006.01)
(52) U.S. Cl. ................... 257/738; 257/734; 257/737; 257/E23.023; 257/E21.509; 438/106
(58) Field of Classification Search ......... 257/734, 257/737, 738, E21.509, E23.023; 438/106
See application file for complete search history.

(56) References Cited
U.S. PATENT DOCUMENTS
5,120,678 A * 6/1992 Moore et al. ............... 29/840

5,847,456 A * 12/1998 Shoji .......................... 257/737

FOREIGN PATENT DOCUMENTS

| JP | 09232373 A | * | 9/1997 |
|----|------------|---|--------|
| JP | 2000-357714 | | 12/2000 |
| JP | 2001-320145 | | 11/2001 |
| JP | 2006-269772 | | 10/2006 |

* cited by examiner

*Primary Examiner*—Bradley K Smith
*Assistant Examiner*—Marvin Payen
(74) *Attorney, Agent, or Firm*—Blakely, Sokoloff, Taylor & Zafman LLP

(57) ABSTRACT

According to one embodiment, there is provided a printed circuit board includes a printed wiring board having a component mounting surface, a semiconductor package which is mounted on the component mounting surface of the printed wiring board by solder bonding using solder balls, and reinforcement portions which locally reinforce portions of the solder bonding of the semiconductor package at a plurality of locations on the component mounting surface of the printed wiring board, the reinforcement portions being formed of a resin material having parts entering the solder balls of the portions of the solder bonding.

9 Claims, 5 Drawing Sheets

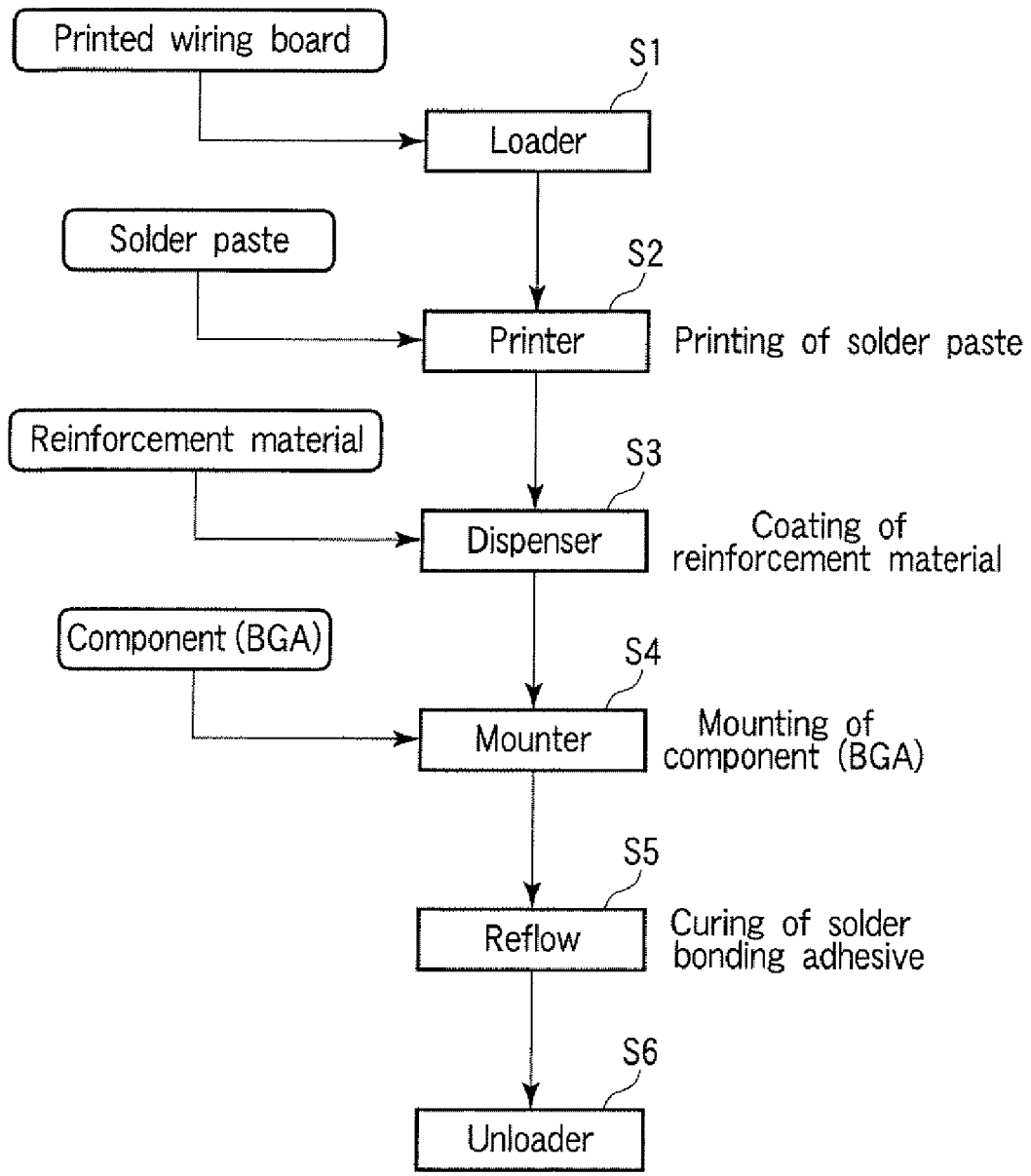
F I G. 4

PRINTED CIRCUIT BOARD, MOUNTING METHOD OF ELECTRONIC COMPONENT, AND ELECTRONIC APPARATUS

CROSS-REFERENCE TO RELATED APPLICATIONS

This application is based upon and claims the benefit of priority from Japanese Patent Application No. 2007-173365, filed Jun. 29, 2007, the entire contents of which are incorporated herein by reference.

BACKGROUND

1. Field

One embodiment of the present invention relates to a printed circuit board on which a semiconductor package is mounted.

2. Description of the Related Art

In an electronic apparatus such as a personal computer, a circuit board, on which a squared large-sized semiconductor package of several-ten millimeters in each side that constitutes a CPU and its peripheral circuits, is accommodated in the casing as a main structural element.

In the circuit board that is used in this type of electronic apparatus, such as a personal computer, protection means is needed for protecting a mounting surface of the semiconductor package from a stress which is applied due to warp or deformation of the board, or shock or vibration from outside.

As means for protecting solder bonding portions of a component, which is mounted on the board, from stress, there is known an electronic component mounting method in which an under-filler (thermoplastic resin) is inserted between the board and a semiconductor chip, so that the gap between the board and the semiconductor chip is filled with the under-filler, thereby fixing the semiconductor chip on the board. See, for example, Jpn. Pat. Appln. KOKAI Publication No. 2000-357714.

In the case where the above-described reinforcement means using the under-filler to the above-described circuit board on which the large-sized semiconductor package is amounted, the reinforcement material, which is filled as the under-filler between the semiconductor package and the board, repeats thermal expansion due to self-heat-production resulting from the circuit operation of the semiconductor package. The thermal expansion causes a problem that an excessive stress acts on the solder bonding portions. In particular, in a circuit board on which a large-sized BGA (ball grid array) is mounted, stress concentrates at corner portions of a rectangular package, causing circuit breakage of the solder bonding portions. This problem is more conspicuous as the thermal expansion coefficient of the reinforcement material filled as the under-filler is more different from that of the semiconductor package or the board. Besides, since the entire mounting surface of the large-sized semiconductor package is bonded to the board, there arises such a problem that rework becomes difficult.

In the mounting technology of BGA, it has conventionally been thought that when the above-described reinforcement means by bonding is used, the adhesive mixes in solder balls and the strength of solder bonding decreases. To cope with this, various measures have been taken in order to prevent mixing of the adhesive in the solder balls. Specifically, the amount of the adhesive (reinforcement material) is decreased or the bonding position is displaced so that the solder balls may not deform, thereby preventing the adhesive from entering the solder balls.

According to an aspect of the present invention, there is provided a printed circuit board comprising: a printed wiring board having a component mounting surface; a semiconductor package which is mounted on the component mounting surface of the printed wiring board by solder bonding using solder balls; and reinforcement portions which locally reinforce portions of the solder bonding of the semiconductor package at a plurality of locations on the component mounting surface of the printed wiring board, the reinforcement portions being formed of a resin material having parts entering the solder balls of the portions of the solder bonding.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 4 is a flow chart illustrating fabrication steps of the printed circuit board according to the first embodiment;

DETAILED DESCRIPTION

Various embodiments according to the present invention will be hereinafter described with reference to the accompanying drawings. In general, according to one embodiment of the invention, there is provided a printed circuit board comprising: a printed wiring board having a component mounting surface; a semiconductor package which is mounted on the component mounting surface of the printed wiring board by solder bonding using solder balls; and reinforcement portions which locally reinforce portions of the solder bonding of the semiconductor package at a plurality of locations on the component mounting surface of the printed wiring board, the reinforcement portions being formed of a resin material having parts entering the solder balls of the portions of the solder bonding.

Embodiments of the present invention will now be described with reference to the accompanying drawings.

Figure 1:
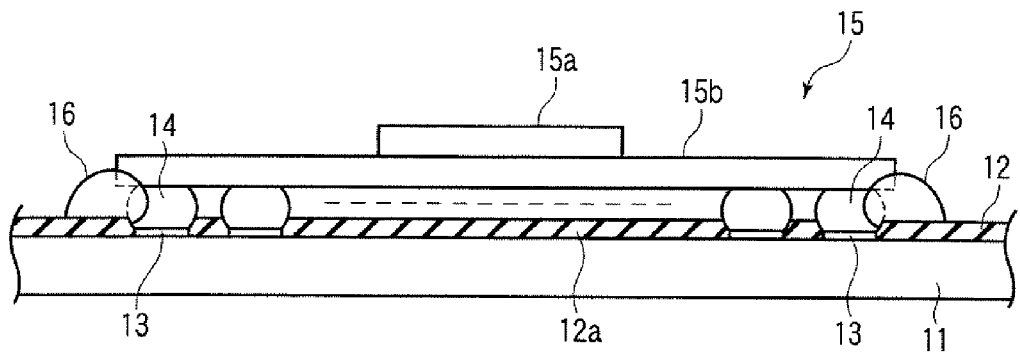
FIG. 1 is a side view showing a printed circuit board according to a first embodiment of the present invention.
Figure 2:
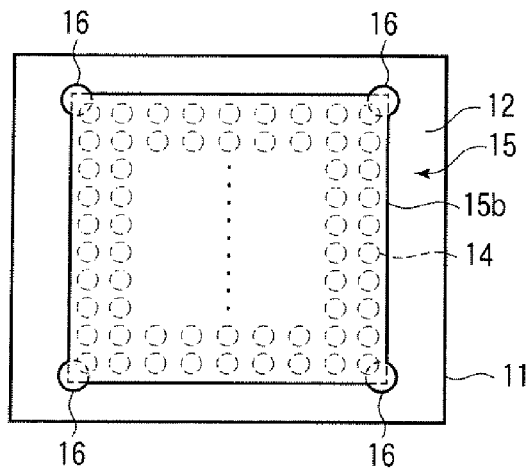
FIG. 2 is a plan view showing the structure of the printed circuit board according to the first embodiment.

FIG. 1 and FIG. 2 show the structure of a printed circuit board according to a first embodiment of the present invention. FIG. 1 is a side view of a main part, and FIG. 2 is a plan view of the main part.

As shown in FIG. 1 and FIG. 2, the printed circuit board according to the first embodiment of the invention comprises a printed wiring board 11; a semiconductor package 15 which has a plurality of solder bonding portions 14 provided on a back surface thereof and is mounted on the printed wiring board 11 by solder bonding using the solder bonding portions 14; and reinforcement portions 16 which locally reinforce parts of the solder bonding portions 14 at a plurality of locations on a mounting surface portion of the printed wiring board 11, the semiconductor package 15 being mounted on the board 11. In this embodiment, a BGA package, in which the solder bonding portions 14 are formed as solder balls, is exemplified as the semiconductor package 15. The BGA package 15 is configured to include a semiconductor chip (bare chip) 15a; a substrate 15b with a rectangular plan-view shape, on which the bare chip 15a is mounted; and a plurality of solder balls which constitute the solder bonding portions 14 provided on a lower surface of the substrate 15b.

On a pattern formation surface 12 of the printed wiring board 11, a BGA component mounting surface portion 12a is pattern-designed such that the BGA package 15 is to be mounted thereon. In this case, the pattern formation surface 12 and the surface portion 12a may be configured by a solder resist film, for example. A plurality of solder bonding pads 13, which correspond to the solder balls 14 of the BGA package 15, are pattern-formed in the BGA component mounting surface portion 12a formed by the solder resist film.

The solder balls 14 of the BGA package 15 are solder-bonded to the solder bonding pads 13 which are provided in the BGA component mounting surface portion 12a. Thereby, BGA package 15 is mounted on the printed wiring board 11 through the BGA component mounting surface portion 12a of the printed wiring board 11.

In a reflow step for solder-bonding the BGA package 15, reinforcement portions 16 for locally reinforcing parts of the solder balls 14 at a plurality of locations are formed by thermally curing a reinforcement material which acts as an adhesive. In this embodiment, the reinforcement portions 16 are formed at every four corner portions of the rectangular substrate 15b of the BGA package 15.

When the reinforcement portions 16 are formed, part of the reinforcement material enters the solder balls 14 which are provided on the corner portions of the substrate 15b, thereby deforming the solder ball 14. The details will be described with reference to FIG. 9 to FIG. 11.

As regards the BGA package 15 that is mounted on the printed wiring board 11 through the BGA component mounting surface portion 12a, the solder balls 14 are locally reinforced by the reinforcement portions 16, in which a thermosetting resin is used as reinforcement material, at the corner portions of the substrate 15b. Further, part of the reinforcement material enters the solder ball 14, thus deforming the solder ball 14 in such a shape that the peripheral surface of the solder ball 14 is bulging, except a surface portion thereof from which the reinforcement material has entered.

By the change in shape of the solder ball 14, the stress at a time of thermal fatigue concentrating at a distal portion of the solder ball located at the corner portion is dispersed over the peripheral surface of the solder ball. Thereby, the stress acting on the solder ball at the corner portion is relaxed.

Figure 9:
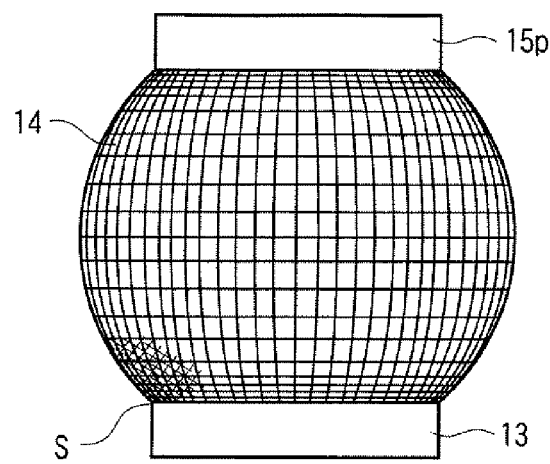
FIG. 9 shows a simulation model of a solder bonding structure of a main part in each of the embodiments of the invention.
Figure 10:
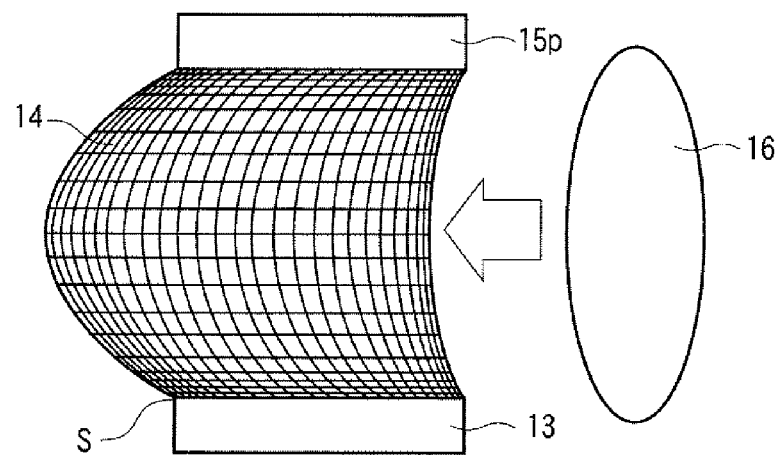
FIG. 10 shows a simulation model of the solder bonding structure of the main part in each of the embodiments of the invention.

FIG. 9 and FIG. 10 show a simulation model of this solder bonding structure. FIG. 9 shows the state in which the solder ball 14 at the corner portion keeps the spherical shape. FIG. 10 shows the state in which part of the reinforcement material, which forms the reinforcement portion 16, enters the solder ball 14 at the corner portion and the solder ball 14 at the corner portion is deformed by the entrance of the reinforcement material 16. In FIG. 9 and FIG. 10, reference numeral 15p denotes an external connection electrode (passivation) provided at a corner portion of the lower surface of the substrate 15b of the BGA package 15.

When the solder ball 14 at the corner portion of the substrate 15b is in the spherical state shown in FIG. 9, the stress at a time of thermal fatigue concentrates at a proximal end part S of the solder ball 14 at the corner portion, leading to breakage of the solder bonding portion which is formed of the solder ball 14 so that reliability in connection deteriorates.

By contrast, in the state shown in FIG. 10 in which part of the reinforcement material, which forms the reinforcement portion 16, enters the solder ball 14 at the corner portion and the solder ball 14 is deformed, the peripheral surface of the solder ball 14 deforms in a bulging shape, except a surface portion thereof from which the reinforcement material that forms the reinforcement portion 16 has entered. By the deformation, the stress concentrating at the proximal end portion S of the solder ball 14 is dispersed to the bulging peripheral surface portion. Thereby, the stress at the time of thermal fatigue, which acts in the solder ball 14 at the corner portion, is relaxed, and breakage of the solder bonding portion can be avoided i.e. the reliability in connection is improved.

Figure 11:
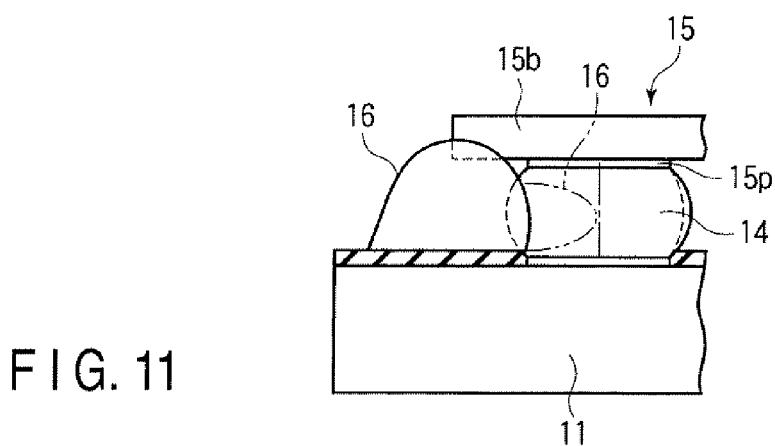
FIG. 11 is a view for explaining the solder bonding structure of the main part in each of the embodiments of the invention.

FIG. 11 shows the state in which part of the reinforcement material that forms the reinforcement portion 16 enters the solder ball 14 at the corner portion, and the tolerable amount of entrance of the reinforcement material 16 that enters the solder ball 14. Further, a broken line indicates the peripheral surface of the solder ball 14 at a time before the peripheral surface of the solder ball 14 at the corner portion deforms and bulges i.e. the peripheral surface in the state in which the solder ball 14 keeps the spherical shape. In FIG. 11, the reinforcement material 16 indicated by a broken line is the tolerable amount of reinforcement material that has entered into the solder ball 14, and a central part (indicated by a dot-and-dash line) of the solder ball 14 at the corner portion is the limit of entrance.

Figure 3:
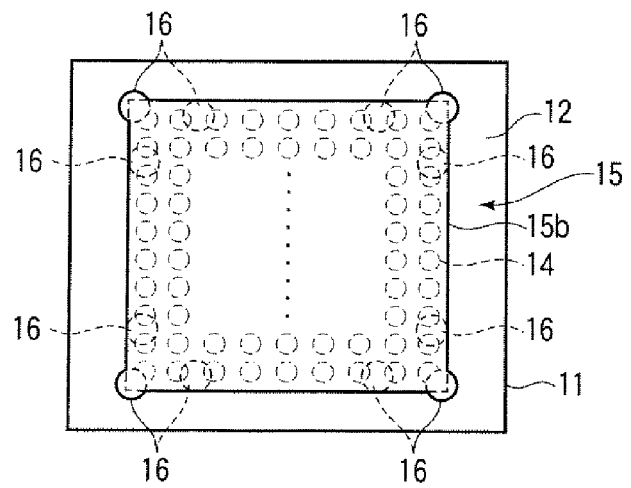
FIG. 3 is a plan view showing the structure of a printed circuit board according to a second embodiment of the present invention.

FIG. 3 shows the structure of a printed circuit board according to a second embodiment of the present invention. In the second embodiment, a plurality of reinforcement portions 16 are provided at each of the corner portions of the substrate 15b of the BGA package 15.

In the first embodiment shown in FIG. 1 and FIG. 2, the reinforcement material 16 is coated at the corner portions of the substrate 15b of the BGA package 15, and a single reinforcement portion 16 is provided at each of the four corner portions of the substrate 15b. In the second embodiment, as shown in FIG. 3, for example, three reinforcement portions 16 are provided at each of the four corner portions, and part of the reinforcement material that forms each reinforcement portion 16 enters, as shown in FIG. 1, the associated solder ball 14 which is in contact with the reinforcement portion 16. With this reinforcement structure, too, the same advantageous effects as in the first embodiment can be obtained.

FIG. 4 illustrates the fabrication steps of the printed circuit board according to each of the above-described embodiments of the invention.

The fabrication steps S1 to S6 illustrated in FIG. 4 are described with reference to FIG. 5 to FIG. 8. In this description, the fabrication steps of the printed circuit board according to the first embodiment shown in FIG. 1 and FIG. 2 are exemplified.

In the fabrication steps shown in FIG. 4, in step S1, a printed wiring board, on which a component is to be mounted, is fed to a component line. The printed wiring board that is fed or loaded in this step is the printed wiring board 11, as shown in FIG. 1. The solder bonding pads 13 corresponding to the solder balls 14, which are provided on the substrate 15b of the BGA package 15, are pattern-formed on the BGA component mounting surface portion 12a which is pattern-designed such that the BGA package 15 is to be mounted thereon.

Figure 5:
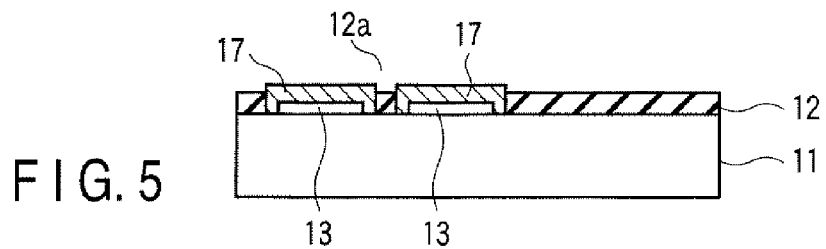
FIG. 5 is a view for describing a fabrication step of the printed circuit board according to the first embodiment.

In step S2, a solder paste is printed on solder bonding parts of the printed wiring board by a printer which is configured to print solder paste. As shown in FIG. 5, the solder paste 17 is printed at portions corresponding to the solder pads 13 which are provided in the BGA component mounting surface portion 12a of the printed wiring board 11.

Figure 6:
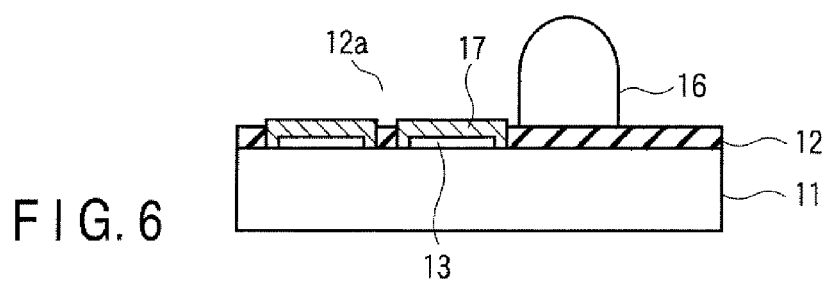
FIG. 6 is a view for describing a fabrication step of the printed circuit board according to the first embodiment.

In step S3, a reinforcement material functioning as an adhesive is coated at locations on the component mounting surface of the printed wiring board 11 at which the reinforcement portions are being formed by a dispenser which is configured to coat reinforcement material. In this case, as shown in FIG. 6, the reinforcement material 16 is locally coated by a nozzle at one location on each corner portion of the BGA component mounting surface portion 12a.

Figure 7:
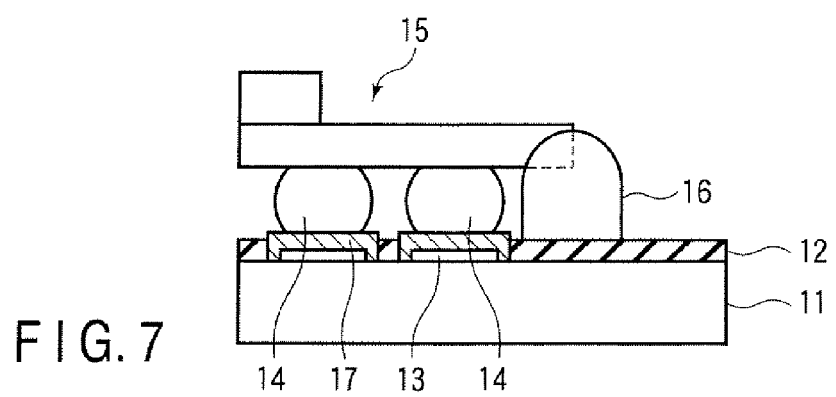
FIG. 7 is a view for describing a fabrication step of the printed circuit board according to the first embodiment.

In step S4, a component is mounted on the component mounting surface of the printed wiring board 11. In this case, as shown in FIG. 7, a BGA package 15 is mounted on the BGA component mounting surface portion 12a or a solder resist film of the printed wiring board 11. At this time of mounting the component 15, the reinforcement material 16 lies in a buried state between the corner portion of the BGA component mounting surface portion 12a and the corner portion of the substrate 15b of the BGA package 15.

Figure 8:
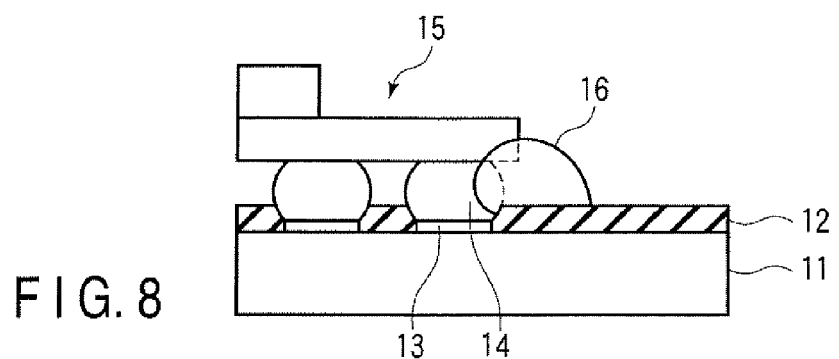
FIG. 8 is a view for describing a fabrication step of the printed circuit board according to the first embodiment.

In step S5 that is a solder reflow step, solder bonding of the mounting component 15 and curing of the reinforcement material or the formation of the reinforcement portion 16 are performed at the same time. In this case, as shown in FIG. 8, on the BGA component mounting surface portion 12a of the printed wiring board 11, the solder balls 14 provided on the substrate 15b of the BGA package 15 are solder-bonded to the solder bonding pads 13 provided on the surface of the board 11 through solder resist film or the BGA component mounting surface portion 12a, and an original pattern of the reinforcement portion 16 formed of the reinforcement material is provided at the corner portion of the substrate 15b. Further, part of the reinforcement material 16 enters the solder ball 14 which is provided at the corner portion of the substrate 15b. By the entrance of the reinforcement material 16, the solder ball 14 is deformed as shown in FIG. 10 and FIG. 11.

In step S6, the printed wiring board or the printed circuit board 11, which is subjected to the reflow process, is unloaded and conveyed to the next fabrication step.

In the above-described fabrication processes for mounting of the component, the solder bonding of the BGA package 15 which is the component to be mounted, the entering of part of the reinforcement material 16 in the solder ball 14, and the curing of the resin that forms the reinforcement portion 16 can be carried out by the single heat treatment at the reflow step.

Figure 12:
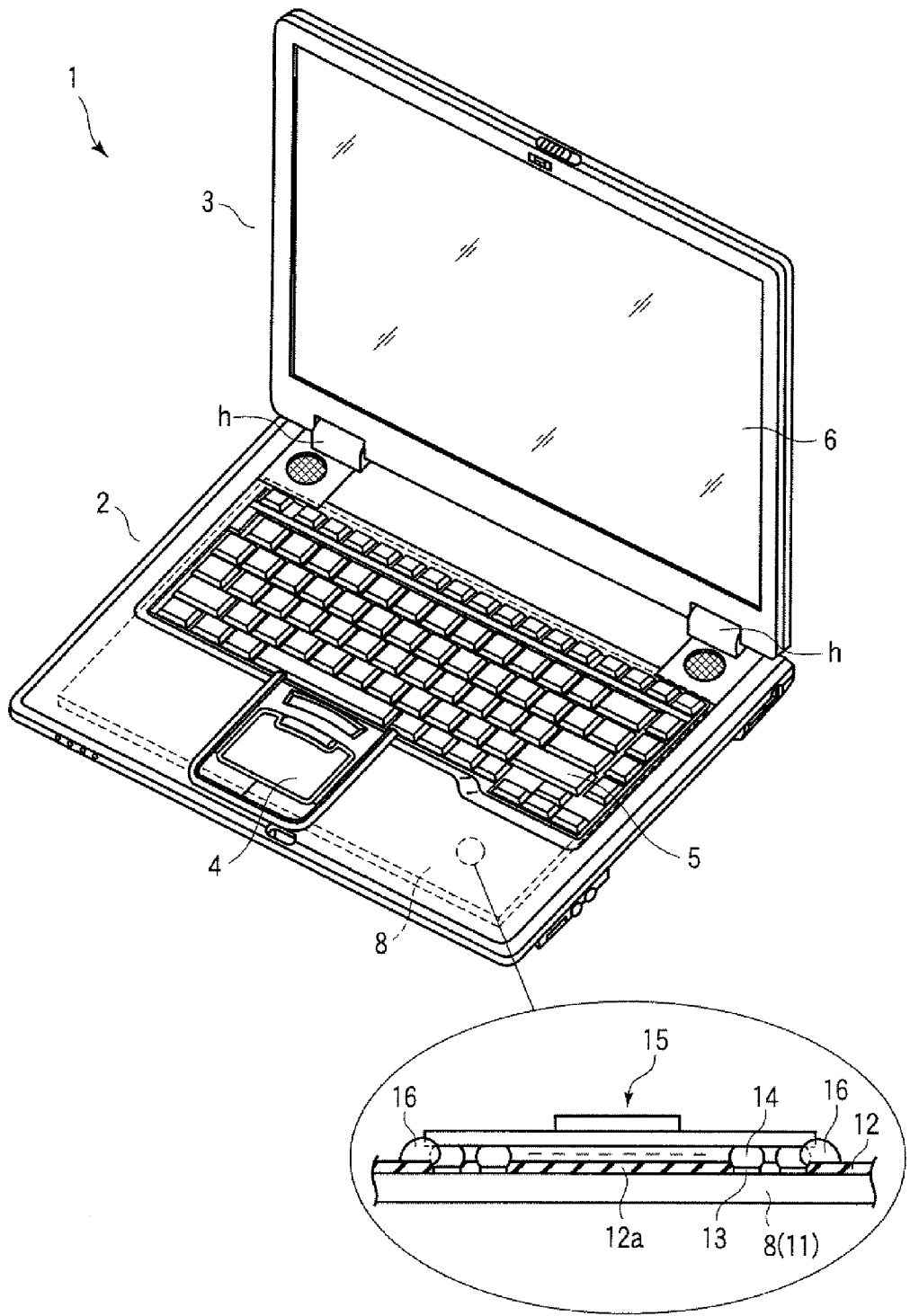
FIG. 12 is a perspective view showing the structure of an electronic apparatus according to a third embodiment of the present invention.

FIG. 12 shows a third embodiment of the present embodiment.

In the third embodiment, an electronic apparatus is constituted by using the printed circuit board or the printed wiring board 11 that is manufactured according to the first embodiment. FIG. 12 shows an embodiment in which the printed circuit board 11 according to the first embodiment is applied to a small-sized electronic apparatus such as a handy-type portable computer.

In FIG. 12, a display unit casing 3 is rotatably disposed on a main body 2 of a portable computer 1 via hinge mechanisms h. Operation units, such as a pointing device 4 and a keyboard 5, are provided on the main body 2. A display device 6, such as an LCD, is provided in the display unit casing 3.

A circuit board 8 acting as a motherboard, on which a control circuit for controlling the operation units, such as the pointing device 4 and keyboard 5, and the display device 6, is assembled, is provided in the main body 2. The circuit board 8 may be realized by using the printed circuit board 11 according to the first embodiment shown in FIG. 1 and FIG. 2.

The circuit board 8 comprises a printed wiring board 11; a BGA package 15 which has a plurality of solder bonding portions 14 on a back surface thereof and is mounted on the printed wiring board 11 by solder bonding of the solder bonding portions 14; and reinforcement portions 16 which locally reinforce parts of the solder bonding portions 14 of the BGA package 15 on a mounting surface portion of the printed wiring board 11, on which the semiconductor package 15 is mounted. As regards the BGA package 15 that is mounted on a BGA component mounting surface portion 12a of the printed wiring board 11, the solder balls 14 are locally reinforced by the reinforcement portions 16, in which a thermosetting resin is used as reinforcement material, at the corner portions of a substrate 15b. Further, part of the reinforcement material enters the solder ball 14, thus deforming the solder ball 14 in such a shape that the peripheral surface of the solder ball 14 is bulging, except a surface portion thereof from which the reinforcement material has entered. By the change in shape of the solder ball 14, the stress at a time of thermal fatigue in the solder balls located at the corner portions is relaxed, and the reliability of connection of the solder bonding surface at the component mounting part can be improved. By this local reinforcement means, it becomes possible to avoid such a problem that the solder bonding portions 14 provided at the corner portions of the BGA package 15 are broken by a thermal or mechanical stress due to, e.g. a dropping impact, leading to defective connection. Therefore, a highly reliable, stable operation can be expected. Furthermore, rework is made easier by the local reinforcement means.

While certain embodiments of the invention have been described, there embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A printed circuit board comprising:
   a printed wiring board having a component mounting surface;
   a semiconductor package mounted on the component mounting surface of the printed wiring board by solder bonding using solder balls; and
   reinforcement portions locally reinforce portions of the solder bonding of the semiconductor package at a plurality of locations on the component mounting surface of the printed wiring board, the reinforcement portions being formed of a resin material having parts entering the solder balls of the portions of the solder bonding, wherein the parts of the resin material entered into the solder balls are separated from the component mounting surface of the printed wiring board and a surface of the semiconductor package substrate.

2. The printed circuit board according to claim 1, wherein the reinforcement portions locally reinforce a plurality of corner portions of the semiconductor package.

3. The printed circuit board according to claim 1, wherein the reinforcement portions locally reinforce a plurality of corner portions of the semiconductor package and parts of two sides neighboring each of the corner portions.

4. The printed circuit board according to claim 1, wherein an amount of entrance of each of the reinforcement portions into the associated solder ball is shallower than a central part of the solder ball.

5. A mounting method of an electronic component for mounting a BGA (ball grid array) component on a component mounting surface of a printed wiring board, comprising:

coating a reinforcement material of a resin material on the component mounting surface in such a manner that the resin material adheres to corner portions of the BGA component when the BGA component is mounted on the component mounting surface of the printed wiring board;

mounting the BGA component on the component mounting surface of the printed wiring board which has been subjected to the reinforcement material coating; and performing reflow heating for solder-bonding the BGA component to the component mounting surface of the printed wiring board, which has been subjected to the component mounting, wherein a part of the resin material enters a solder ball of a part of the solder-bonding at the corner portions of the BGA component, wherein the parts of the resin material being entered into the solder balls are separated from the component mounting surface of the printed wiring board and a surface of the semiconductor package substrate, the resin material is cured, and a reinforcement portion of the resin material is locally formed at the part of the solder-bonding of the BGA component.

6. An electronic apparatus comprising:

a housing; and a circuit board provided in the housing, the circuit board comprising a printed wiring board having a component mounting surface, a semiconductor package mounted on the component mounting surface of the printed wiring board by solder bonding of solder balls, and reinforcement portions which locally reinforce portions of the solder bonding of the semiconductor package at a plurality of locations on the component mounting surface of the printed wiring board, the reinforcement portions being formed of a resin material having parts entering the solder balls of the portions of the solder bonding, wherein the parts of the resin material entered into the solder balls are separated from the component mounting surface of the printed wiring board and a surface of the semiconductor package substrate 7. The electronic apparatus according to claim 6, wherein the reinforcement portions locally reinforce a plurality of corner portions of the semiconductor package.

8. The electronic apparatus according to claim 6, wherein the reinforcement portions locally reinforce a plurality of corner portions of the semiconductor package and parts of two sides neighboring each of the corner portions.

9. The electronic apparatus according to claim 6, wherein an amount of entrance of each of the reinforcement portions into the associated solder ball is shallower than a central part of the solder ball.

* * * * *